(12) United States Patent
Song

(10) Patent No.: US 7,222,261 B2
(45) Date of Patent: May 22, 2007

(54) AUTOMATIC TEST EQUIPMENT FOR DESIGN-FOR-TEST (DFT) AND BUILT-IN-SELF-TEST CIRCUITRY

(75) Inventor: Lee Song, Simi Valley, CA (US)

(73) Assignee: Teradyne, Inc., North Reading, MA (US)

( * ) Notice: Subject to any disclaimer, the term of this patent is extended or adjusted under 35 U.S.C. 154(b) by 310 days.

(21) Appl. No.: 10/176,281

(22) Filed: Jun. 19, 2002

(65) Prior Publication Data

US 2003/0237025 A1    Dec. 25, 2003

(51) Int. Cl.
  *G06F 11/00* (2006.01)
(52) U.S. Cl. ......................... 714/30; 714/724
(58) Field of Classification Search .............. 714/30, 714/715, 733; 702/117; 324/765, 500
  See application file for complete search history.

(56) References Cited

U.S. PATENT DOCUMENTS

| | | | |
|---|---|---|---|
| 5,568,493 A * | 10/1996 | Morris ........................ 714/726 |
| 5,923,676 A | 7/1999 | Sunter et al. |
| 6,005,407 A | 12/1999 | Arabi et al. |
| 6,163,862 A | 12/2000 | Adams et al. |
| 6,184,048 B1 | 2/2001 | Ramon |
| 6,229,465 B1 | 5/2001 | Bulaga et al. |
| 6,331,770 B1 * | 12/2001 | Sugamori ................ 324/158.1 |
| 6,333,706 B1 | 12/2001 | Cummings et al. |
| 6,339,388 B1 * | 1/2002 | Matsumoto ................ 341/120 |
| 6,408,412 B1 * | 6/2002 | Rajsuman ................... 714/724 |
| 6,449,741 B1 * | 9/2002 | Organ et al. ................ 714/724 |
| 6,512,989 B1 * | 1/2003 | Deome et al. ................ 702/124 |
| 6,675,339 B1 * | 1/2004 | Lanier et al. ................ 714/744 |
| 6,690,189 B2 * | 2/2004 | Mori et al. .................. 324/765 |
| 6,728,916 B2 * | 4/2004 | Chen et al. .................. 714/733 |
| 6,925,408 B2 * | 8/2005 | Premy et al. ................ 702/120 |
| 6,959,409 B2 * | 10/2005 | AbdEl-Wahid .............. 714/740 |
| 7,036,062 B2 * | 4/2006 | Morris et al. ................ 714/733 |

* cited by examiner

*Primary Examiner*—Robert Beausoliel
*Assistant Examiner*—Philip Guyton
(74) *Attorney, Agent, or Firm*—Daly, Crowley, Mofford & Durkee, LLP

(57) ABSTRACT

An analog/mixed-signal DFT/BIST test module for use in a semiconductor tester to support DFT/BIST testing of semiconductor devices having at least one analog/mixed-signal circuit-under-test is disclosed. The analog/mixed-signal circuit-under-test coupled to an on-chip test circuit having a test signal input and a test signal output. The analog/mixed-signal DFT/BIST test module includes signal source circuitry for generating test signals for application to the test signal input of the analog/mixed-signal circuit-under-test and capture circuitry for acquiring output signals from the test signal output of the analog/mixed-signal circuit-under-test. Processing circuitry responsive to user-programmed algorithms analyzes the output signals from the analog/mixed-signal circuit under test independent of the semiconductor tester host computer.

21 Claims, 5 Drawing Sheets

FIGURE 5

```
Main Control Loop
   ┌─▶ 10110HLHLXX-----10110H--
   │   HHLHL-----111------X00
   │   XXXXX----11101000000LHH
   │   10110HLHLXX-----10110H--
   │   HHLHL-----111------X00
   │   XXXXX----111WWWWWWWWWWW
   │   10110HLHLXXWWWWWWWWWWWWW
   │   HHLHL----WWWWWWWWWWWWWWW
   │   XXXXX----111WWWWWWWWWWW
   │   10110HLHLXX-----10110H--
   │   HHLHL-----111------X00
   │   XXXXX----11101000000LHH
   │   10110HLHLXX-----10110H--
   │   HHLHL-----111------X00
   │   XXXXX----11101000000LHH
   │   10110HLHLXX-----10110H--
   │   HHLHL-----111------X00
   │   XXXXX----111VVVVVVVVVVV
   │   10110HLHLXXVVVVVVVVVVVVV
   │   HHLHL----VVVVVVVVVVVVVVV
   │   XXXXX----111VVVVVVVVVVV
   │   XXXXX----VVVVVVVVVVVVVVV
   │   XXXXX----111VVVVVVVVVVV
   │   10110HLHLXX-----10110H--
   │   HHLHL-----111------X00
   └── XXXXX----11101000000LHH
```

71
73
77

```
01000000110
01010110001
11110110110
01000000001
00110110110
11100110100
01000000101
```

```
????????????
????????????
????????????
????????????
????????????
????????????
????????????
```

75
79
81

AUTOMATIC TEST EQUIPMENT FOR DESIGN-FOR-TEST (DFT) AND BUILT-IN-SELF-TEST CIRCUITRY

FIELD OF THE INVENTION

The invention relates generally to automatic test equipment and more particularly an apparatus and method for testing and analyzing semiconductor devices that employ analog/mixed-signal design for test or built in self test (DFT/BIST) circuitry.

BACKGROUND OF THE INVENTION

Conventional automatic test equipment (ATE) typically tests semiconductor devices according to a functional test scheme. This approach verifies that the device performs its intended function under a variety of realistic operating conditions. Use of the functional test approach often requires the generation of functional test patterns that exercise the device through its external interface.

As device complexities and densities increase, functional test costs tend to correspondingly increase. In particular, the volume of functional test pattern data required to achieve acceptable fault coverage may increase exponentially with the size of the device.

In an effort to lower these costs, many semiconductor manufacturers have employed structured design-for-test (DFT) and built-in-self-test (BIST) methods. With many of these test methods, the goal changes from verifying functionality to finding manufacturing defects. DFT and BIST methods generally rely on additional circuitry provided on the device to enhance the controllability and observability of the internal state of the device. In some cases, the resulting circuit may be adequately tested with lower-cost automatic test equipment.

While the art is replete with conventional standardized circuit schemes for digital DFT/BIST, the conventional approach to analog/mixed-signal DFT/BIST is far different. Conventionally, in order to implement and analyze test results for analog/mixed-signal circuit components such as analog-digital (A-D) converters, phase-locked-loops (PLL), digital-analog (D-A) converters, etc., using DFT/BIST techniques, different methods are typically implemented for each analog/mixed-signal circuit component. As a result, manufacturers have resorted to using custom ad-hoc analog/mixed-signal DFT methods (circuitry and software) to achieve desired results.

Generically, the conventional customized ad-hoc methods to approaching analog/mixed-signal DFT/BIST follow a common high-level scheme. Referring to FIG. 1, an analog or mixed-signal device-under-test (DUT) 10 includes one or more analog/mixed-signal circuits-under-test (CUT) 12. DFT/BIST circuitry employed in the DUT to test the CUT includes a drive/sense interface circuit 14 to sample and measure signals from the analog CUT and/or to drive signal into the CUT, and a digital load/capture circuit 16 to convert the sampled analog signals to digital signals and process the signals into a more useable format. Scan chain register circuitry 18 includes scan chain registers 20 that couple to the digital load/capture circuitry and TAP (Test Access Port) interface circuitry 22 to facilitate the transfer of data off the DUT to automatic test equipment (ATE) 30. Both TAP and or scan chain registers may be used to transfer data off of the DUT.

The ATE 30 often includes a host computer 32 that acts as a controller for one or more instruments 34. The instruments may include waveform digitizers, logic analyzers, etc., and are coupled conventionally in the tester as is well known to those skilled in the art. Conventionally, analog/mixed-signal DFT/BIST data is captured by digital instruments able to take advantage of the scan chain interface employed by the DUT 10. In operation, data from the analog/mixed-signal DFT/BIST circuitry that is acquired by the ATE digital instrument 34 is then fed to the ATE host computer 32 where it is processed and analyzed by vendor-supplied (or user-developed) custom analysis software algorithms tailored to the analog/mixed-signal DFT/BIST circuitry employed in the DUT 10.

As noted above, due to the ad-hoc nature of conventional analog/mixed-signal DFT/BIST methods, the circuitry and analysis software are typically customized for each type of analog/mixed-signal CUT and multiple analysis software may be needed if more than one type of DFT/BIST method is deployed on a given device. In other words, the DFT/BIST circuitry to test an A-D converter is different than that used to test a PLL, which is different than that to test D-A converters, etc. This lack of standardization often forces the semiconductor device manufacturer to implement custom analysis tools for each type of analog/mixed-signal CUT that translates into a higher cost of test for the semiconductor device manufacturer.

In addition to the ad-hoc methodology discussed above, conventional analog/mixed-signal DFT/BIST methods have often led to prolonged test times, often reducing device throughput, or required off-line analysis to determine pass/fail results which added to the cost of test. This is shown in FIG. 2, where, after each test of an analog/mixed-signal CUT 12, in steps 40, 44, and 48, the test is disrupted while the ATE host computer 32 directs its computing resources to analyzing the test results, at steps 42, 46, and 50. This stop and go test/analyze approach is undesirable to semiconductor manufacturers who value fast test rates in order to maximize device throughput. Some semiconductors manufacturers use off-line analysis to determine pass/fail in order to minimize the negative impact on the ATE. However, this method is also undesirable as it adds another process step and requires transfer of large amounts of data from the ATE to off-line storage.

What is needed and currently unavailable is a universal parallel processing approach to test and analyze DUTs that employ analog/mixed-signal DFT/BIST circuitry. The automatic test equipment analog/mixed-signal DFT/BIST apparatus and method of the present invention satisfies these needs.

SUMMARY OF THE INVENTION

The automatic test equipment analog/mixed-signal DFT/BIST apparatus and method of the present invention provides a unique universal and parallel approach to testing semiconductor devices with ATE and analog/mixed-signal DFT/BIST tools. This minimizes test time and costs for device manufacturers.

To realize the foregoing advantages, the invention in one form comprises an analog/mixed-signal DFT/BIST test module for use in a semiconductor tester to support DFT/BIST testing of semiconductor devices having at least one analog/mixed-signal circuit-under-test. The analog/mixed-signal circuit-under-test coupled to an on-chip test circuit having a test signal input and/or a test signal output. The analog/mixed-signal DFT/BIST test module includes signal source circuitry for generating test signals for application to the test signal input of the analog/mixed-signal circuitunder-test and capture circuitry for acquiring output signals from the test signal output of the analog/mixed-signal circuit-under-test. Processing circuitry responsive to user-programmed algorithms analyzes the output signals from the analog circuit under test independent of the semiconductor tester host computer.

In another form, the invention comprises a semiconductor tester adapted for supporting DFT/BIST testing of a semiconductor device having at least one analog/mixed-signal circuit-under-test. The analog circuit-under-test coupled to an on-chip test circuit having a test signal input and/or a test signal output. The semiconductor tester includes a host computer responsive to user-programmed tester software and pin electronics circuitry for interfacing the host computer to the semiconductor device. The pin electronics circuitry includes an analog/mixed-signal DFT/BIST test module having a test signal generator for generating and applying test source signals for application to the analog/mixed-signal circuit under test and capture circuitry for acquiring output signals from the analog/mixed-signal circuit under test in response to the test source signals. Processing circuitry responsive to user-programmed algorithms analyzes the output signals from the analog circuit under test independent of the host computer.

In a further form, the invention comprises a method of testing a semiconductor device having at least one analog/mixed-signal circuit-under-test. The analog circuit-under-test coupled to an on-chip test circuit having a test signal input and/or a test signal output. The method comprising the steps of applying input test signals to the analog/mixed-signal circuit-under-test; capturing output signals generated by the analog/mixed-signal circuit-under-test in response to the input signals; transferring the captured output signals to a local processor; and analyzing the captured output signals in accordance with a pre-programmed algorithm while simultaneously repeating the applying and capturing steps.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which

FIG. 5 is a chart illustrating the cooperation between the analog/mixed-signal DFT/BIST module and the ATE LVM/SVM.

DETAILED DESCRIPTION OF THE INVENTION

Figure 1:
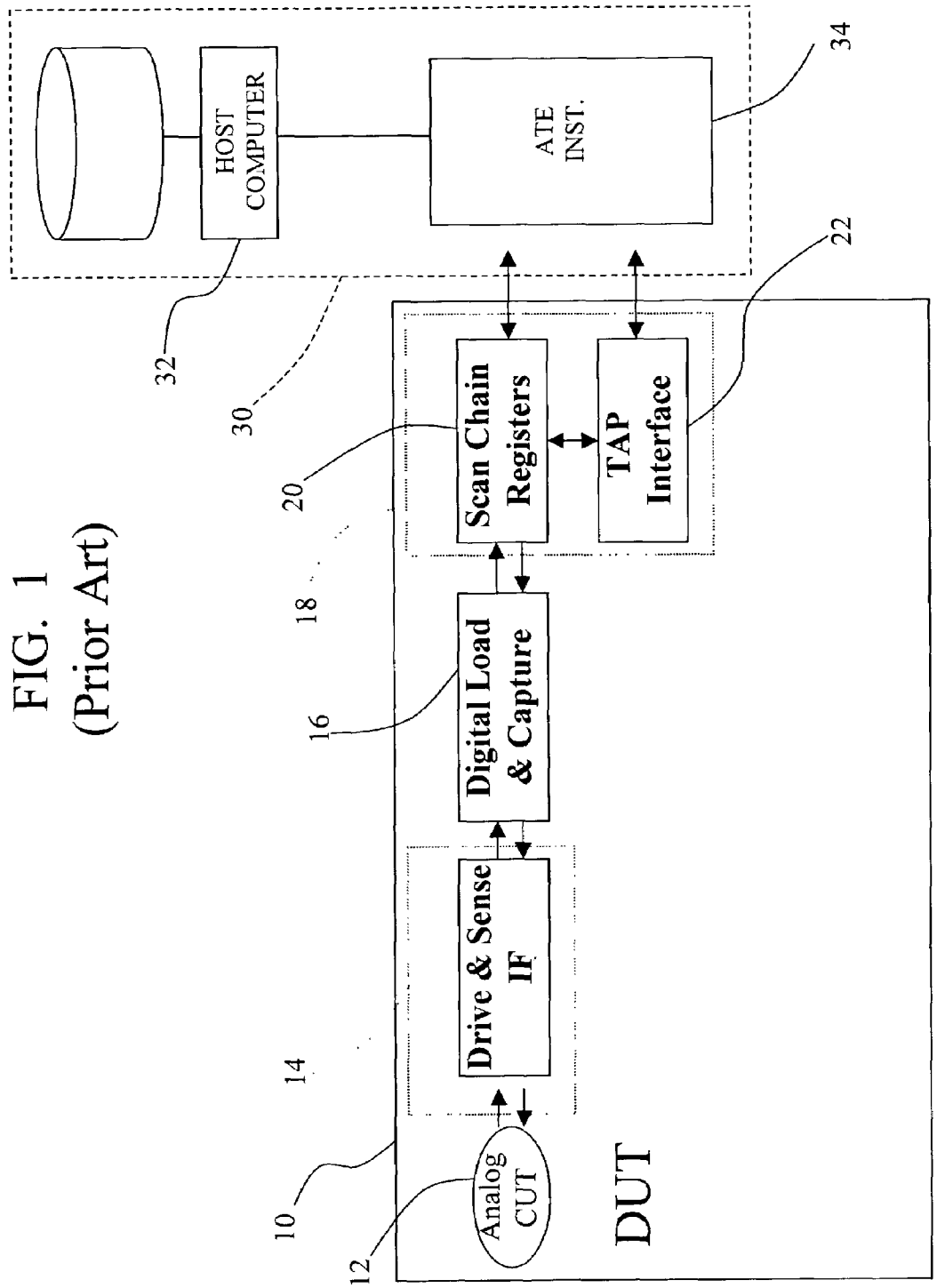
FIG. 1 is a simplified block diagram of a generic conventional scheme for testing and analyzing DUTs having analog/mixed-signal CUTs.
Figure 2:
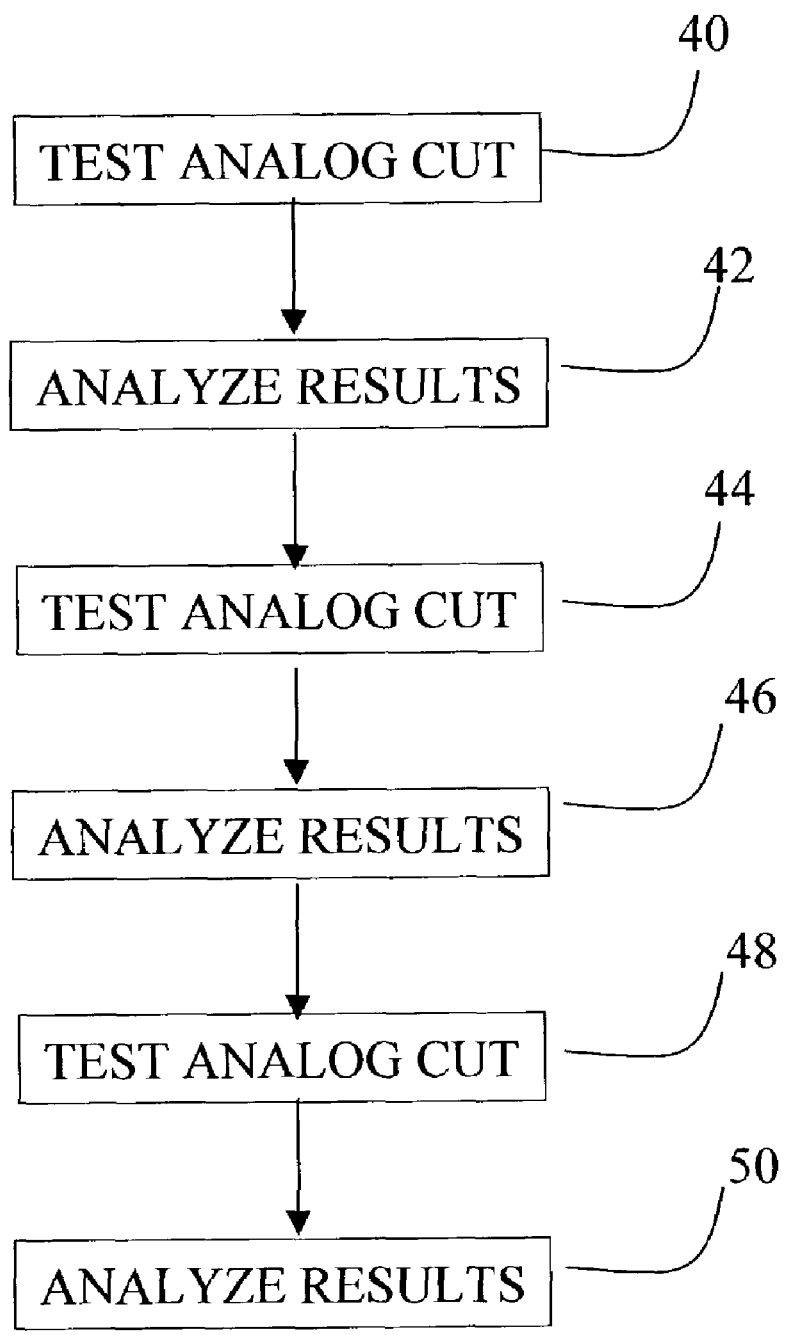
FIG. 2 is a generic flowchart illustrating the conventional analog/mixed-signal DFT/BIST test and analysis process flow.
Figure 3:
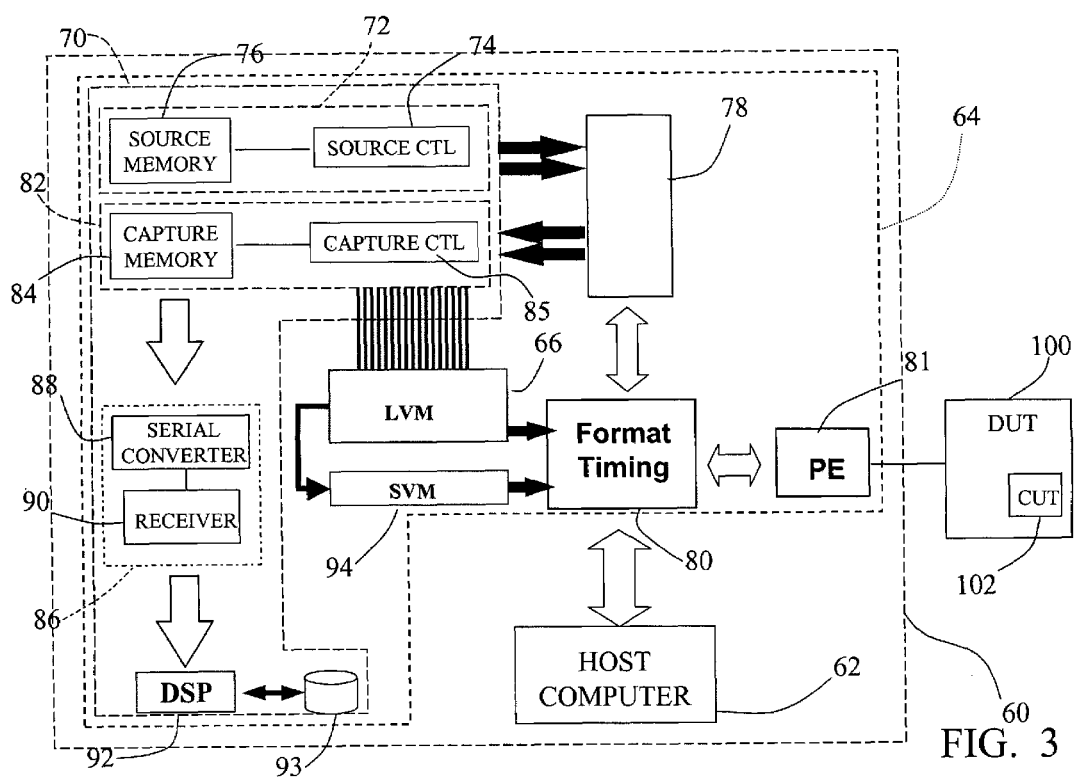
FIG. 3 is a block diagram of the automatic test equipment analog/mixed-signal DFT/BIST apparatus according to one form of the present invention.

The present invention allows semiconductor manufacturers to universally test analog/mixed-signal DFT/BIST circuitry with ATE without tying-up the host computing resources of the ATE. More specifically, the present invention is directed to selectively testing analog/mixed-signal DFT/BIST circuitry within a DUT without tying up valuable tester resources from the basic tester configuration. Referring to FIG. 3, this is accomplished by employing an analog/mixed-signal DFT/BIST test module 70 in the ATE tester electronics. As more fully explained below, the test module includes its own test signal generator 72, capture circuitry 82 and processing circuitry 92 for analyzing selective test results independent of the basic tester resources.

Further referring to FIG. 3, the ATE 60 generally includes a host computer 62 that interacts with the tester electronics 64 to provide control over the test. A user-defined test pattern for directing how the test is controlled is stored in a large vector memory (LVM) 66 and/or small vector memory (SVM) 94. LVM-like memory generally stores patterns that are linear in its execution, while SVM-like memory generally stores patterns that are non-linear in its execution. The LVM/SVM stores a majority of the test program for overall control of a variety of possible instruments (not shown) employed by the ATE. The analog/mixed-signal DFT/BIST test module 70 of the present invention is one such instrument that enables the ATE to quickly test and analyze analog/mixed-signal DFT/BIST output data.

With continued reference to FIG. 3, the test module test signal generator 72 comprises a source controller circuit 74 that uses a source memory 76 effectively in conjunction with the LVM and SVM, as more fully described below. The source memory stores pre-programmed pattern data for selective application by the source controller circuit through an alternate data bus 78 to formatting/timing circuitry 80. As is well known in the art, signals from the formatting, timing circuitry drive pin electronics circuits 81 that interface the tester to the DUT 100. Pattern data for defining test signals is programmed into the source memory exclusively for testing only the analog/mixed-signal DFT/BIST circuitry. The source controller circuit operates to control the signal flow in and out of the source memory 76 in conjunction with the rest of the circuits.

Further referring to FIG. 3, the capture circuitry 82 is constructed similar to the test signal generator 72, including a capture memory 84 under control of a capture controller circuit 85. The capture controller circuit is similar in construction to the source controller circuit 74 and programmed to detect the analog/mixed-signal DFT/BIST outputs responsive to the applied source test signals and store the signals in the capture memory 84. It is envisioned that the source memory 76 and the capture memory 84 may be partitioned within a larger overall memory scheme rather than two separate memories as described above. Similarly, a single controller circuit may suffice to perform dual roles of the source and capture controllers.

Preferably, the test signal generation circuitry 72 and capture circuitry 82 comprise digital circuits to take advantage of the digital outputs normally provided by the DUT analog/mixed-signal DFT/BIST circuitry.

In a preferred embodiment, the signal generation circuitry 72 and capture circuitry 82 are available as a digital instrument under the trade name Digital Signal I/O, or DSIO, available from the assignee of the present invention. The inventor has unexpectedly discovered that, in addition to the high-level generic hardware/software similarities between the various analog DFT/BIST approaches, portions of the analog DFT/BIST test patterns are often repeated in control loops. By employing a digital instrument that targets the changing patterns within certain control loops in a test, the overall size of the ATE LVM/SVM may be maintained at a cost-effective level while adding analog DFT/BIST testing functionality.

FIG. 5 illustrates generally, how in one application, the signal generation circuitry 72 and capture circuitry 82 supplement the LVM/SVM. A portion of a test pattern control loop 71 is shown, as stored in the LVM/SVM, with test vectors running horizontally. A first supplemental pattern array 73, filled with "W"s, indicates that the data needs to be generated from the signal generation circuitry 72. This data, for example, may represent the digital representation of an analog waveform as shown at 75, for input into the analog/mixed-signal CUT.

Similarly, a second pattern array 77, filled with "V"s, indicates that the values (from the analog/mixed-signal DFT/BIST circuit) will be compared to LOW or HIGH level and sent to the capture circuitry 82. This data, processed with local processing circuitry as more fully described below, may represent a captured waveform, such as that at 79, to produce an analog measurement such as signal distortion, as shown at 81. In this manner, the control loop can be repeated multiple times to enable the re-use of the LVM/SVM program, inserting the variable cycle-cycle data from the analog/mixed-signal DFT/BIST module where appropriate. This aids in minimizing the size of the LVM/SVM memory, which often becomes very large and costly.

Referring back to FIG. 3, the test module capture memory 84 couples to a programmable data bus 86 having the unique ability to automatically transfer data from the capture memory 84 to an analysis processor 92. Generally, the data bus provides circuitry that performs a serial conversion of the capture data with a serial to parallel converter 88 in an appropriate protocol, and transmits the data to a logic-controlled receiver 90. This can be bypassed under user control depending on the situation. The analysis processor 92 couples to the receiver to gain access to the data. The programmable data bus is more fully described in copending U.S. patent application Ser. No. 10/186,195 titled INSTRUMENT INITIATED COMMUNICATION FOR AUTOMATIC TEST EQUIPMENT, filed Jun. 28, 2002, assigned to the assignee of the present invention, and expressly incorporated herein by reference.

With continued reference to FIG. 3, the analysis processor 92 preferably comprises a DSP and is universally adapted for analyzing many forms of output data. A user merely programs the DSP according to the expected data format of the data to be analyzed, and employs algorithms in a program memory 93 to determine the DFT/BIST test results from the captured analog DFT/BIST circuitry. Preferably, the analysis processor comprises a general purpose processor, such as a microprocessor, digital signal processor (DSP), or microcontroller. In one preferred embodiment, it is implemented using a general purpose processor such as that known under the trademark PowerPC, available from IBM or Motorola.

A key advantage of the present invention enabled by the local analysis processor 92 is the ability to analyze test results with the test module 64 without interfering with a continuing or subsequent test on the device-under-test 100. This is due to the fact that the ATE host computer 62 is free to continue testing, or begin a new test rather than stop testing in order to analyze the analog/mixed-signal DFT/BIST data. The control of the test module 64 to act in parallel with the basic tester resources is governed by a subroutine vector memory (SVM) 94, which includes user-programmed microcode to carry out the test.

Preferably, the test module 64 includes several channels' worth of resources, with each channel including the signal generator 72, capture circuitry 82, transfer circuitry 86, and analysis resources 92 described above. Consequently, a plurality of channels may operate in parallel to test one or more devices in an effort to achieve even greater throughput.

Figure 4:
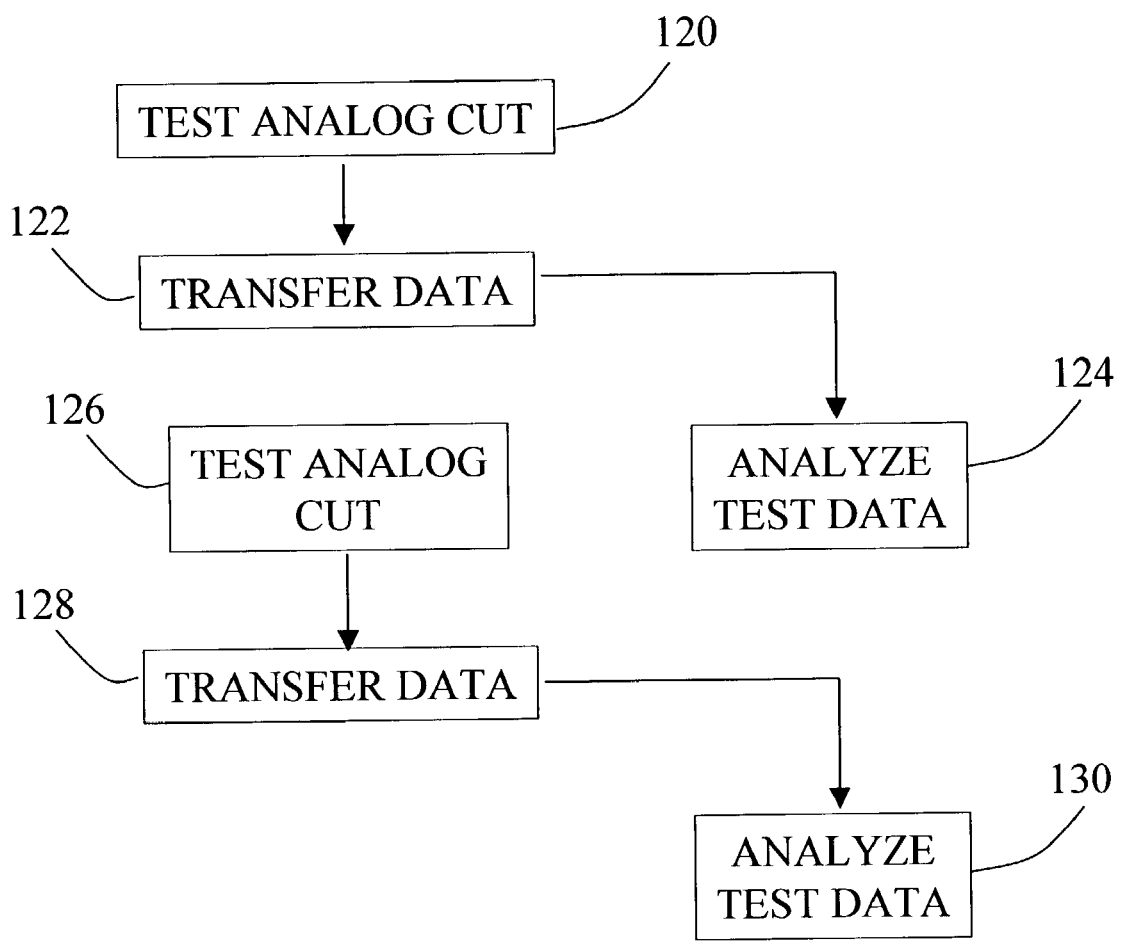
FIG. 4 is a flowchart illustrating the parallel test and analysis method of the present invention carried out by the automatic test equipment analog/mixed-signal DFT/BIST apparatus shown in FIG. 3.

In operation, one or more test modules 64 are configured to adequately test the analog/mixed-signal DFT/BIST CUT 102 on the DUT 100, depending on the level of resources required by the user. As FIG. 4 illustrates, test pattern waveforms are generated by the test module signal generation circuitry 72, the output signals are received by the capture circuitry 82 to effect a first test on the analog/mixed-signal CUT 102 at step 120. The captured DFT/BIST data is then transferred from the capture memory 84 via the programmable bus 86 to the analysis DSP 92, at step 122, where the data is analyzed in accordance with user-programmed algorithms, at step 124.

Concurrent with the analysis step 124, the host computer 62 and or test module 64 conducts a further test, at step 126, similar to the initial test, where the previously described steps are repeated in steps 128 and 130. In other words, as the data from the first test is being processed and analyzed by the analysis DSP, the tester simultaneously conducts a subsequent test on the DUT. In this manner, true parallel processing is achieved to maximize device throughput, correspondingly lowering test costs.

Those skilled in the art will appreciate the many benefits and advantages afforded by the present invention. Of significant importance is the universal capability that the ATE provides due to the ability of the analog DFT/BIST test module. This allows the semiconductor manufacturer to merely program the test module analysis processor for reuseable data analysis rather than run separate computer program analyses on the ATE host computer. Moreover, by using the analysis processor resources to analyze the DFT/BIST data, the host computer is free to carry out subsequent tests with little to no down-time.

While the invention has been particularly shown and described with reference to the preferred embodiments thereof, it will be understood by those skilled in the art that various changes in form and detail may be made therein without departing from the spirit and scope of the invention. For example, while the description herein consistently identifies digital-signal-processors as the preferred form of data processor, general purpose processors or controllers are also viewed within the scope of the present invention.

What is claimed is:

1. A test module comprising:

single source circuitry to generate a test signal to a test signal input of a design-for-test (DFT)/Built-in-system-test (BIST) analog/mixed-signal circuit-under-test included in a semiconductor device based on user-defined test patterns received from a vector memory, the vector memory configured to provide repeatable test patterns to the single source circuitry in a user-programmable control loop;

capture circuitry configured to receive an output signal from a test signal output of the DFT/BIST analog/mixed-signal circuit-under-test based on the user-defined test patterns received from the vector memory;

processing circuitry configured to respond to user-programmed algorithms and configured to analyze the output signal from the DFT/BIST analog/mixed-signal circuit-under-test independent of the host computer; and a programmable data bus coupled to the capture circuitry and the processing circuitry and configured to provide data from the capture circuitry to the processing circuitry;

wherein the test module is configured for use in a semiconductor tester comprising a host computer.

2. The test module of claim 1 wherein the processing circuitry comprises:
at least one processor.

3. The test module of claim 2 wherein the at least one processor comprises a digital-signal-processor configured to be programmed by a user.

4. The test module of claim 1 wherein:
the signal source circuitry comprises a digital signal source; and
the capture circuitry comprises a digital capture circuit.

5. The test module of claim 1 wherein the programmable data bus comprises a serial-to-parallel convener coupled to a logic-controlled receiver.

6. A semiconductor tester comprising:
a host computer configured to respond to user-programmed tester software;
a vector memory comprising user-defined test patterns, the vector memory configured to provide repeatable test patterns in a user-programmable control loop;
pin electronics circuitry configured to interface the host computer to the semiconductor device; and
a test module comprising:
a test signal generator configured to generate and apply test source signals to a test signal input of a design-for-test (DFT)/built-in-system-test (BIST) analog/mixed-signal circuit-under-test included in a semiconductor device being tested based on the user-defined test patterns received from the vector memory in the user-programmable control loop;
capture circuitry configured to receive output signals from a test signal output of the DFT/BIST analog/mixed-signal circuit-under-test in response to the test source signals based on the user defined test patterns received from the vector memory; and
processing circuitry configured to respond to user-programmed algorithms to analyze the output signals from the DFT/BIST analog/mixed-signal circuit-under-test independent of the host computer; and
a programmable data bus coupled to the capture circuitry and the processing circuitry and configured to provide data from the capture circuitry to the processing circuitry.

7. The semiconductor tester of claim 6 wherein the host computer is remote from the semiconductor device, and the test module is local to the semiconductor device.

8. The semiconductor tester of claim 6 wherein the processing circuitry comprises:
at least one processor.

9. The semiconductor tester of claim 8 wherein the at least one processor comprises a digital-signal-processor configured to be programmed by a user.

10. The semiconductor tester of claim 6 wherein:
the test signal generator comprises a digital signal source; and
the capture circuitry comprises a digital capture circuit.

11. The semiconductor tester of claim 6 herein the programmable data bus comprises a serial-to-parallel convener coupled to a logic-controlled receiver.

12. A method of testing a semiconductor device comprising:
applying input test signals to a test signal input of a design-for-test (DFT)/built-in-system-test (BIST) analog/mixed-signal circuit-under-test included in the semiconductor device based on user-defined test patterns received from a vector memory, the vector memory configured to provide repeatable test patterns in a user-programmable control loop;
capturing output signals from a test signal output of the DFT/BIST analog/mixed-signal circuit-under-test in response to the test input signals based on the user defined test patterns received from the vector memory;
transferring the output signals through a programmable data bus to a local processor; and
analyzing the output signals in accordance with a pre-programmed algorithm while simultaneously repeating the applying and the capturing.

13. The method of claim 12 wherein transferring the output signals to a local processor comprises transferring the output signals to a digital signal processor.

14. The method of claim 12 wherein applying input test signals comprises applying digital test input signals.

15. The method of claim 12 wherein capturing output signals comprises capturing digital output signals.

16. The method of claim 12, further comprising converting the outputs signal from a serial data format to a parallel data format using a serial-to-parallel converter.

17. A test module comprising:
a means for generating test signals for application to a test signal input of a design-for-test/built-in-system-test (BIST) analog/mixed-signal circuit-under-test included in a semiconductor device based on user-defined test patterns received from a vector memory, the vector memory configured to provide repeatable test patterns to the means for generating test signals in a user-programmable control loop;
a means for acquiring output signals from a test signal output of the DFT/BIST analog/mixed-signal circuit-under-test based on the user defined test patterns received from the vector memory;
a means, responsive to user-programmed algorithms, for analyzing the output signals from the DFT/BIST analog/mixed-signal circuit-under-test independent of the host computer; and
a means for transferring the output signals, including a programmable data bus, from the means for acquiring output signals to the means for analyzing the output signals;
wherein the test module is configured for use in a semiconductor tester comprising a host computer.

18. The test module of claim 17 wherein the means for generating comprises digital signal source circuitry.

19. The test module of claim 17 wherein the means for acquiring comprises digital capture circuitry.

20. The test module of claim 17 wherein the means for analyzing comprises:
at least one processor.

21. The test module of claim 17 wherein the programmable data bus comprises a serial-to-parallel converter coupled to a logic-controlled receiver.

* * * * *